United States Patent
Lin et al.

(10) Patent No.: US 9,236,298 B2
(45) Date of Patent: Jan. 12, 2016

(54) METHODS FOR FABRICATION INTERCONNECT STRUCTURES WITH FUNCTIONAL COMPONENTS AND ELECTRICAL CONDUCTIVE CONTACT STRUCTURES ON A SAME LEVEL

(71) Applicant: GLOBALFOUNDRIES U.S. 2 LLC, Hopewell Junction, NY (US)

(72) Inventors: Qinghuang Lin, Yorktown Heights, NY (US); Dirk Pfeiffer, Croton on Hudson, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/717,387

(22) Filed: May 20, 2015

(65) Prior Publication Data
US 2015/0255337 A1    Sep. 10, 2015

Related U.S. Application Data

(62) Division of application No. 13/228,023, filed on Sep. 8, 2011.

(51) Int. Cl.
*H01L 21/768* (2006.01)
*H01L 21/3105* (2006.01)
(Continued)

(52) U.S. Cl.
CPC ...... *H01L 21/76879* (2013.01); *H01L 21/3105* (2013.01); *H01L 21/31058* (2013.01); *H01L 21/31144* (2013.01); *H01L 21/76801* (2013.01); *H01L 21/76802* (2013.01); *H01L 21/76819* (2013.01); *H01L 21/76825* (2013.01); *H01L 21/76826* (2013.01); *H01L 21/76828* (2013.01); *H01L 21/76829* (2013.01); *H01L 23/5223* (2013.01); *H01L 23/5227* (2013.01); *H01L 23/5228* (2013.01); *H01L 23/5329* (2013.01); *H01L 23/53238* (2013.01); *H01L 23/53276* (2013.01); *H01L 28/90* (2013.01); *H01L 45/06* (2013.01); *H01L 45/1226* (2013.01);
(Continued)

(58) Field of Classification Search
CPC .................................................. H01L 21/76802
See application file for complete search history.

(56) References Cited

U.S. PATENT DOCUMENTS 4,808,545 A    2/1989    Balasubramanyam et al.
5,461,003 A    10/1995    Havemann et al.
(Continued)

FOREIGN PATENT DOCUMENTS

KR    100809901 B1    3/2008

OTHER PUBLICATIONS

U.S. Office Action mailed Feb. 23, 2015 in U.S. Appl. No. 13/970,124.
(Continued)

*Primary Examiner* — Thanh V Pham
(74) *Attorney, Agent, or Firm* — Hoffman Warnick LLC

(57) ABSTRACT

An electronic device includes an interlevel dielectric layer formed over a substrate and has a first set of openings and a second set of openings formed through the interlevel dielectric layer. The substrate includes conductive areas. A conductive contact structure is formed in the first set of openings in the interlevel dielectric layer to make electrical contact with the conductive areas of the substrate. A functional component is formed in the second set of openings in the interlevel dielectric layer and occupies a same level as the conductive contact structure.

17 Claims, 5 Drawing Sheets

(51) Int. Cl.
*H01L 21/311* (2006.01)
*H01L 23/522* (2006.01)
*H01L 23/532* (2006.01)
*H01L 49/02* (2006.01)
*H01L 45/00* (2006.01)

(52) U.S. Cl.
CPC ..... *H01L45/1683* (2013.01); *H01L 2221/1094* (2013.01); *H01L 2924/0002* (2013.01)

(56) References Cited

U.S. PATENT DOCUMENTS

| | | |
|---|---|---|
| 5,651,857 A | 7/1997 | Cronin et al. |
| 5,795,830 A | 8/1998 | Cronin et al. |
| 5,913,113 A | 6/1999 | Seo |
| 5,976,768 A | 11/1999 | Brown et al. |
| 5,981,148 A | 11/1999 | Brown et al. |
| 6,007,968 A | 12/1999 | Furukawa et al. |
| 6,014,422 A | 1/2000 | Boyd et al. |
| 6,025,260 A | 2/2000 | Lien et al. |
| 6,037,195 A | 3/2000 | Toriyama et al. |
| 6,093,508 A | 7/2000 | Cote |
| 6,114,082 A | 9/2000 | Hakey et al. |
| 6,150,256 A | 11/2000 | Furukawa et al. |
| 6,165,893 A | 12/2000 | Chung |
| 6,184,041 B1 | 2/2001 | Furukawa et al. |
| 6,194,268 B1 | 2/2001 | Furukawa et al. |
| 6,200,726 B1 | 3/2001 | Chen et al. |
| 6,214,719 B1 | 4/2001 | Nag |
| 6,221,562 B1 | 4/2001 | Boyd et al. |
| 6,245,488 B1 | 6/2001 | Furukawa et al. |
| 6,252,290 B1 | 6/2001 | Quek et al. |
| 6,284,439 B1 | 9/2001 | Holmes et al. |
| 6,313,492 B1 | 11/2001 | Hakey et al. |
| 6,337,278 B1 | 1/2002 | Butler |
| 6,338,934 B1 | 1/2002 | Chen et al. |
| 6,440,635 B1 | 8/2002 | Holmes et al. |
| 6,492,256 B2 | 12/2002 | Lee et al. |
| 6,492,732 B2 | 12/2002 | Lee et al. |
| 6,514,857 B1 | 2/2003 | Naik et al. |
| 6,649,531 B2 | 11/2003 | Cote et al. |
| 6,737,708 B2 | 5/2004 | Zhang et al. |
| 6,780,753 B2 | 8/2004 | Latchford et al. |
| 6,805,109 B2 | 10/2004 | Cowan |
| 6,825,562 B2 | 11/2004 | Naik et al. |
| 7,030,031 B2 | 4/2006 | Wille et al. |
| 7,041,748 B2 | 5/2006 | Lin et al. |
| 7,056,840 B2 | 6/2006 | Miller et al. |
| 7,071,532 B2 | 7/2006 | Geffken et al. |
| 7,091,611 B2 | 8/2006 | Ahn et al. |
| 7,125,793 B2 | 10/2006 | Liou et al. |
| 7,138,329 B2 | 11/2006 | Lur et al. |
| 7,235,473 B2 | 6/2007 | Jawarani et al. |
| 7,253,095 B2 | 8/2007 | Lur et al. |
| 7,265,013 B2 | 9/2007 | Furukawa et al. |
| 7,265,103 B2 | 9/2007 | Furukawa et al. |
| 7,294,568 B2 | 11/2007 | Goodner et al. |
| 7,294,934 B2 | 11/2007 | Kloster et al. |
| 7,306,853 B2 | 12/2007 | Lin et al. |
| 7,338,896 B2 | 3/2008 | Vanhaelemeersch et al. |
| 7,344,827 B2 | 3/2008 | Takemura et al. |
| 7,361,454 B2 | 4/2008 | Kobayashi |
| 7,361,991 B2 | 4/2008 | Saenger et al. |
| 7,432,041 B2 | 10/2008 | Lin |
| 7,566,598 B2 | 7/2009 | Wu et al. |
| 7,585,614 B2 | 9/2009 | Furukawa et al. |
| 7,709,370 B2 | 5/2010 | Allen et al. |
| 7,811,923 B2 | 10/2010 | Lin et al. |
| 7,919,225 B2 | 4/2011 | Allen et al. |
| 7,968,382 B2 | 6/2011 | Jinbo et al. |
| 8,029,971 B2 | 10/2011 | Allen et al. |
| 8,084,862 B2 | 12/2011 | Lin et al. |
| 8,236,599 B2 | 8/2012 | Chang et al. |
| 8,586,404 B2 | 11/2013 | Huang et al. |
| 2001/0021577 A1 | 9/2001 | Brown et al. |
| 2001/0054766 A1 | 12/2001 | Dirahoui et al. |
| 2002/0142531 A1 | 10/2002 | Hsu et al. |
| 2002/0158337 A1 | 10/2002 | Babich et al. |
| 2003/0012539 A1 | 1/2003 | Mule et al. |
| 2003/0127426 A1 | 7/2003 | Chang et al. |
| 2004/0094821 A1 | 5/2004 | Lur et al. |
| 2004/0137241 A1 | 7/2004 | Lin et al. |
| 2005/0009305 A1 | 1/2005 | Anderson et al. |
| 2007/0099416 A1 | 5/2007 | Furukawa et al. |
| 2007/0166981 A1 | 7/2007 | Furukawa et al. |
| 2007/0249170 A1 | 10/2007 | Kewley |
| 2008/0008969 A1 | 1/2008 | Zhou et al. |
| 2008/0122106 A1 | 5/2008 | Nitta et al. |
| 2008/0142995 A1 | 6/2008 | Furukawa et al. |
| 2008/0150091 A1 | 6/2008 | Lin |
| 2008/0176396 A1 | 7/2008 | Futase et al. |
| 2008/0187731 A1 | 8/2008 | Allen et al. |
| 2008/0265377 A1 | 10/2008 | Clevenger et al. |
| 2009/0079075 A1 | 3/2009 | Lin et al. |
| 2009/0079076 A1 | 3/2009 | Lin et al. |
| 2009/0081418 A1 | 3/2009 | Allen et al. |
| 2009/0149026 A1 | 6/2009 | Zhou et al. |
| 2009/0166612 A1 | 7/2009 | Cain et al. |
| 2009/0174067 A1 | 7/2009 | Lin |
| 2009/0233226 A1 | 9/2009 | Allen et al. |
| 2010/0009131 A1 | 1/2010 | Basker et al. |
| 2010/0028801 A1 | 2/2010 | Holmes et al. |
| 2010/0112463 A1 | 5/2010 | Yune |
| 2010/0197096 A1 | 8/2010 | Johnson et al. |
| 2010/0207276 A1 | 8/2010 | Allen et al. |
| 2010/0314767 A1 | 12/2010 | Chen et al. |
| 2010/0314768 A1 | 12/2010 | Darnon et al. |
| 2010/0319971 A1 | 12/2010 | Lin |
| 2011/0074044 A1 | 3/2011 | Lin et al. |
| 2011/0130006 A1 | 6/2011 | Abatchev et al. |
| 2011/0193167 A1 | 8/2011 | Fung et al. |
| 2011/0304053 A1 | 12/2011 | Lin et al. |
| 2012/0018891 A1 | 1/2012 | Lin |
| 2012/0261829 A1 | 10/2012 | Lin et al. |
| 2013/0299883 A1 | 11/2013 | Lin et al. |

OTHER PUBLICATIONS

U.S. Office Action mailed on Nov. 12, 2014 in U.S. Appl. No. 13/468,576.
U.S. Office Action mailed on Mar. 20, 2014 in U.S. Appl. No. 13/088,110.
U.S. Office Action mailed on May 27, 2014 in U.S. Appl. No. 13/606,788.
U.S. Office Action mailed on Nov. 5, 2013 in U.S. Appl. No. 13/088,110.
Jung et al., Patterning With Spacer for Expanding the Resolution Limit of Current Lithography Tool, Proc. of SPIE, vol. 6156, 61561J-1, Feb. 2006, pp. 1-9.
Jung et al., Patterning With Amorphous Carbon Spacer for Expanding the Resolution Limit of Current Lithography Tool, Proc. of SPIE, vol. 6520 65201C-1, Feb. 2007, pp. 1-9.
Maenhoudt et al., Alternative Process Schemes for Double Patterning That Eliminate the Intermediate Etch Step, Proc. of SPIE, vol. 6924, 69240P-1, Feb. 2008, pp. 1-12.
U.S. Office Action mailed on Jun. 18, 2013 in U.S. Appl. No. 13/197,325.
U.S. Office Action mailed on Feb. 26, 2013 in U.S. Appl. No. 13/197,325.
U.S. Office Action mailed on Mar. 19, 2014 in U.S. Appl. No. 13/088,083.
U.S. Office Action mailed on Oct. 24, 2013 in U.S. Appl. No. 13/088,083.
Lindert, L., et al. "A Novel EDRAM MIM Capacitor Integrated in a High Performance 32 nm Logic Technology" 2011 Symposium on VLSI Technology. Jun. 2011. (2 Pages).

METHODS FOR FABRICATION INTERCONNECT STRUCTURES WITH FUNCTIONAL COMPONENTS AND ELECTRICAL CONDUCTIVE CONTACT STRUCTURES ON A SAME LEVEL

RELATED APPLICATION INFORMATION

This application is a divisional application of U.S. patent application Ser. No. 13/228,023 filed on Sep. 8, 2011, incorporated herein by reference in their entirety.

This application is related to commonly assigned application Ser. No. 13/088,054, entitled: INTERCONNECT STRUCTURE AND METHOD FOR FABRICATING ON-CHIP INTERCONNECT STRUCTURES BY IMAGE REVERSAL filed on Apr. 15, 2011 now U.S. Pat. No. 9,054,160; commonly assigned application Ser. No. 13/088,083, entitled METHOD FOR FORMING SELF-ALIGNED AIR-GAP INTERCONNECT STRUCTURES filed on Apr. 15, 2011 now U.S. Pat. No. 8,900,988; commonly assigned application Ser. No. 13/088,110, entitled: MIDDLE OF LINE STRUCTURES filed on Apr. 15, 2011 now U.S. Pat No. 8,890,318; and commonly assigned application Ser. No. 13/197,325, entitled: SELF-ALIGNED FINE PITCH PERMANENT ON-CHIP INTERCONNECT STRUCTURES AND METHOD OF FABRICATION filed on Aug. 3, 2011 now U.S. Pat. No. 8,822,137 all incorporated herein by reference.

BACKGROUND

1. Technical Field

The present invention relates to semiconductor structures and fabrication methods, and in particular to functional structures formed with metal interconnects on a same layer and methods for fabricating the same.

2. Description of the Related Art

Typical conventional integration schemes for forming electrical contacts for transistors in a semiconductor chip include depositing a nitride stop layer on top of finished front end of line (FEOL) devices (e.g., transistors). An oxide layer is deposited and planarized. Contact patterns are formed by lithography on a regular resist, resist on antireflection coating (ARC) mask stacks or multiple layer mask stacks, such as a tri-layer mask stack, which need to be removed in later steps. Plasma etch processes are used to transfer the contact patterns into the oxide layer by opening the ARC layer, etching through the oxide layer, which typically has a different thickness on the top of gate and source/drain areas of the transistors, and then stopping on the nitride stopping layer. The nitride stopping layer is etched through—stopping on silicide layers on top of the gate and source/drain areas.

Current integration schemes and process flows for contact formation etch contact holes and stop on top of the gates and on the top of silicides in the source/drain area. These structures include only conductive materials for forming interconnects between adjacent layers.

SUMMARY

A semiconductor device includes an interlevel dielectric layer formed over a substrate and has a first set of openings and a second set of openings formed through the interlevel dielectric layer. The substrate includes conductive areas. A conductive contact structure is formed in the first set of openings in the interlevel dielectric layer to make electrical contact with the conductive areas of the substrate. An electrically functional component is formed in the second set of openings in the interlevel dielectric layer and occupies a same level as the conductive contact structure. The electrically functional component is selected from a transistor device, a memory element, a capacitor, a diode, or a combination thereof. A permanent antireflective layer is also included directly under the interlevel dielectric layer.

An electronic device includes an interlevel dielectric layer formed over a substrate and having a first set of openings and a second set of openings formed through the interlevel dielectric layer. The substrate includes electrically conductive areas. An electrically conductive contact structure is formed in the first set of openings in the interlevel dielectric layer to make electrical contact with the conductive areas of the substrate. A functional component is formed in the second set of openings in the interlevel dielectric layer and occupies a same level as the electrically conductive contact structure.

A method for fabricating an electronic device includes forming an interlevel dielectric layer over a substrate; patterning the interlevel dielectric layers to form openings therein; blocking a first set of the openings with a block mask; forming functional components in a second set of openings; planarizing the surface of the functional components and the block mask in the first set of the openings; removing the block mask to recover the first set of openings in the interlevel dielectric layer; and filling the first set of openings with an electrically conductive fill material to form electrically conductive contacts which occupy a same level as the functional components.

Another method for fabricating an electronic device includes forming an interlevel dielectric layer over a substrate; patterning the interlevel dielectric layer to form openings therein; forming a sacrificial patternable dielectric layer over a top surface of the interlevel dielectric layer and in the openings of the interlevel dielectric layer; patterning the sacrificial patternable dielectric layer to remove the sacrificial patternable dielectric layer from a second set of the openings and leaving the sacrificial patternable dielectric layer as a block mask in a first set of the openings; curing the sacrificial patternable dielectric layer on the top surface of the interlevel dielectric layer and in the first set of the openings to convert the sacrificial patternable dielectric layer into a cured dielectric layer; forming functional components in the second set of openings; planarizing a surface of the functional components and the block mask in the first set of the openings; removing the cured dielectric layer to recover the first set of openings in the interlevel dielectric layer; and filling the first set of openings with an electrically conductive fill material to form electrically conductive contacts which occupy a same level as the functional components.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1A:
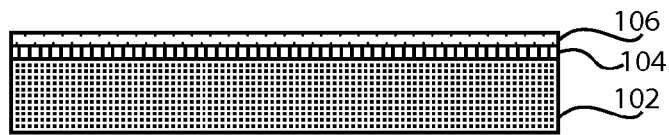
FIG. 1A shows a cross-sectional view of a device having an antireflection coating and a cap layer formed in accordance with one illustrative embodiment.

The present principles provide electrically conductive contact structures and functional components in a same metallization layer. Methods for fabrication include the formation of functional components in recesses or trenches formed for conductive interconnect structures. The functional components may include transistors, such as vertical transistors, memory storage devices, such as phase change memory, capacitors, etc. The functional components are preferably formed in layers normally employed for interconnect structures. In particularly useful embodiments, new integration schemes are provided to form contacts or metal lines with functional components laterally adjacent thereto.

In some embodiments, drawbacks of conventional integration processes are avoided by, e.g., combining the functions of a photoresist and a dielectric material into one material. This one material, which may be referred to as a photo-patternable low-k (low dielectric constant) material (PPLK) herein, acts as a photoresist during the lithographic patterning process and, as such, a separate photoresist is not required or used. After lithographic patterning, the patternable low-k material is subsequently converted into a low-k material with a post patterning cure. In this way, the methods disclosed herein reduce plasma induced dielectric damage and the need for plasma etching, complex sacrificial film stacks and processes needed for patterning these stacks. Moreover, the methods disclosed herein also afford superior pattern profile control.

In the following description, numerous specific details are set forth, such as particular structures, components, materials, dimensions, processing steps and techniques, to provide a thorough understanding of the present principles. However, it will be appreciated by one of ordinary skill in the art that these specific details are illustrative and should not be construed as limiting.

It will be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Interlayer dielectric materials employed herein are preferably materials that act as a low-k (low dielectric constant) dielectric insulator. A cure process may be employed with a PPLK material that results in a cured product of an interlayer dielectric material, therefore, can serve as an on-chip dielectric insulator. The terms "cure" or "curing" are used interchangeable to refer to one of the processes selected from a thermal cure, an electron beam cure, an ultra-violet (UV) cure, an ion beam cure, a plasma cure, a microwave cure or a combination thereof. A "cured" product of an interlayer dielectric material is the product of the interlayer dielectric material after it has undergone a cure process. The "cured" product of an interlayer dielectric material may be different from the original interlayer dielectric material in chemical nature and physical, mechanical and electrical properties.

It is to be understood that the present invention will be described in terms of a given illustrative architecture having a semiconductor wafer or substrate; however, other architectures, structures, substrate materials and process features and steps may be varied within the scope of the present invention.

Circuits or structures as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

FIGS. 1A-1J show an illustrative embodiment for forming a single damascene structure with functional components formed in interconnects layers in accordance with the present principles. Referring now to the drawings in which like numerals represent the same or similar elements and initially to FIG. 1A, a substrate 102 may include a semiconductor substrate, e.g., silicon, GaAs, silicon on insulator, or may include lower level metal layers in interlevel dielectric materials. The substrate 102 may include an electrically semiconducting material, an insulating material, a conductive material, devices or structures made of these materials or any combination thereof (e.g., a lower level of an interconnect structure). When the substrate 102 is comprised of a semiconducting material, any semiconductor such as Si, SiGe, SiGeC, SiC, Ge alloys, GaAs, InAs, InP and other III/V or II/VI compound semiconductors, or organic semiconductors may be employed. The substrate 102 may also be a flexible substrate including devices that are suitable for high-speed roll-to-roll processing. In addition to these listed types of semiconducting materials, substrate 102 may also be a layered semiconductor such as, for example, Si/SiGe, Si/SiC, silicon-on-insulators (SOIs) or silicon germanium-on-insulators (SGOIs). These semiconductor materials may form a device, devices or structures, which may be discrete or interconnected. These devices and device structures may be for computation, transmission, storage or display of information, such as logic devices, memory devices, switches or display devices.

When the substrate 102 is an electrical insulating material, the insulating material can be an organic insulator, an inorganic insulator or a combination thereof including multilayers. The substrate 102 may also include a photo-patternable low-k (PPLK) dielectric material. These electrical insulating materials may be part of a device, devices or structures, which may be discrete or interconnected. These devices and structures may be for logic applications, memory applications, etc. When the substrate 102 is an electrically conducting material, the substrate may include, for example, polysilicon, an elemental metal, an alloy including at least one elemental metal, a metal silicide, a metal nitride or combinations thereof including multilayers. When the substrate 102 includes a semiconducting material, one or more semiconductor devices such as, for example, complementary metal oxide semiconductor (CMOS) devices, strained silicon devices, carbon-based (carbon nanotubes and/or graphene) devices, phase-change memory devices, magnetic memory devices, magnetic spin switching devices, single electron transistors, quantum devices, molecule-based switches and other switching or memory devices that can be part of an integrated circuit, can be fabricated thereon.

An optional cap layer 104 and an optional antireflection coating (ARC) 106 may be formed over the substrate 102. Although both layers 104 and 106 are shown, it should be understood that the cap layer 104 and ARC 106 may be employed without the other or may not be used at all. The optional cap 104 may be formed on the surface of substrate 102 utilizing a conventional deposition process such as, for example, chemical vapor deposition (CVD), plasma enhanced chemical vapor deposition (PECVD), atomic layer deposition (ALD), chemical solution deposition (such as spin coating), or evaporation. The dielectric cap 104 may include any suitable dielectric capping material such as, for example, SiC, SiN, $SiO_2$, a carbon doped oxide, a nitrogen and hydrogen doped silicon carbide SiC(N,H) or multilayers thereof. Dielectric cap 104 may be a continuous layer or a discontinuous layer. Dielectric cap 104 may also be a layer with graded composition in the vertical direction.

After the deposition of the dielectric cap 104, a post deposition treatment may be applied to modify the properties of either the entire layer or the surface of the dielectric cap 104. This post deposition treatment can be selected from heat treatment, irradiation of electromagnetic wave (such as of ultra-violet light), particle beam (such as an electron beam, or an ion beam), plasma treatment, chemical treatment through a gas phase or a liquid phase (such as application of a monolayer of surface modifier) or any combination thereof. This post-deposition treatment can be blanket or pattern-wise. The post deposition treatment enhances the chemical, physical, electrical, and/or mechanical properties of the dielectric cap 104, such as, e.g., adhesion strength. The chemical properties include nature and/or location of surface functional groups, and hydrophilicity. The physical properties include density, moisture absorption, and heat conductivity. The mechanical properties include modulus, hardness, cohesive strength, toughness, resistance to crack and adhesion strength to its neighboring layers. The electrical properties include dielectric constant, electrical breakdown field, and leakage current.

The heat treatment should be no higher than the temperature that the underlying substrate 102 can withstand, usually about 500° C. This heat treatment can be conducted in an inert environment or within a chemical environment in a gas phase or a liquid phase. This treatment step may or may not be performed in the same tool as that used in forming the dielectric cap 104.

The post deposition treatment by irradiation of electromagnetic waves can be by ultra-violet (UV) light, microwave and the like. The UV light can be broadband with a wavelength range from 100 nm to 1000 nm. It can also be UV light generated by an excimer laser or other UV light source. The UV treatment dose can be a few $mJ/cm^2$ to thousands of $J/cm^2$. This irradiation treatment can be conducted at ambient temperature or at an elevated temperature no higher than 500° C. and can be conducted in an inert environment or within a chemical environment in a gas phase or a liquid phase. The following conditions may be employed in some embodiments: a radiation time from 10 sec to 30 min, a temperature from room temperature to 500° C., and an environment including vacuum, or gases such as, for example, inert gas, $N_2$, $H_2$, $O_2$, $NH_3$, hydrocarbon, and $SiH_4$. This treatment step may or may not be performed in the same tool as that used in forming the dielectric cap 104.

The post deposition treatment by plasma can be selected from oxidizing plasma, reducing plasma or a neutral plasma. Oxidizing plasmas include, for example, $O_2$, CO, and $CO_2$. Reducing plasmas include, for example, $H_2$, $N_2$, $NH_3$, and $SiH_4$. The neutral plasmas include, for example, Ar and He. A plasma treatment time from 1 sec to 10 min and a plasma treatment temperature from room temperature to 400° C. can be employed. This treatment step may or may not be performed in the same tool as that used in forming the dielectric cap 104.

The post deposition chemical treatment may also be conducted in a gas phase or a liquid phase. In one embodiment, the following conditions may be employed: a treatment time from 1 sec to 30 min, a temperature from room temperature (i.e., from 20° C. to 30° C.) to 500° C. Chemicals suitable for this chemical treatment may be selected from any chemicals that improve chemical, physical, electrical, and/or mechanical properties of the dielectric cap layer, such as adhesion strength. This chemical treatment may penetrate the entire layer of dielectric cap 104 or may be limited only to the surface of the dielectric cap 104. Example chemicals include adhesion promoters such as silanes, siloxanes and silylation agents. This treatment step may or may not be performed in the same tool as that used in forming the dielectric cap 104.

The thickness of the dielectric cap 104 may vary depending on the technique used to form the same as well as the material make-up of the layer. The dielectric cap 104 may have a thickness from 2 nm to 55 nm, and more preferably a thickness from 10 nm to 45 nm.

Next, the optional ARC 106 is formed on a surface of the optional dielectric cap 104, if present, or directly on a surface of the substrate 102 when the dielectric cap 104 is not present. The ARC 106 may be a single layer, multilayer or a graded layer with a composition that varies along the vertical direction. The ARC 106: (i) acts as an antireflective coating (ARC) during a lithographic patterning process; (ii) withstands high-temperature back-end-of line (BEOL) integration processing (e.g., up to about 500° C.); (iii) prevents resist (e.g., the PPLK material) poisoning by the substrate 102; (iv) provides a vertical wall profile and sufficient etch selectivity between layers (e.g., the ARC layer 106 and above layers); (v) serves as a permanent dielectric layer in a chip (low dielectric constant, e.g., k<5, more commonly k<3.6); and (vi) is compatible with conventional BEOL integration and produces reliable hardware.

Antireflective coatings are known to those skilled in the art and include, for example, organic homopolymers or copolymers of polyesters, polyimides, polyacrylates, polymethacrylates, polysulfones, and amorphous carbon that satisfy all of the characteristics of ARC 106 mentioned above. The ARC 106 may be applied by spin-on techniques, spray on techniques, dipping, etc. Inorganic antireflective coatings, such as silicon oxynitride (SiON), silicon carbide (SiC), silicon oxycarbide (SiOC), SiCOH, siloxane, silane, carbosilane, oxycarbosilane, and silsesquioxane, either as a polymer or a copolymer may also be employed and may be deposited, for example, by plasma-enhanced chemical vapor deposition, spin-on techniques, dipping, etc. The ARC 106 may include atoms of M, carbon (C) and hydrogen (H), wherein M is at least one of Si, Ge, B, Sn, Fe, Ta, Ti, Ni, Hf and La.

When ARC 106 is a multilayer ARC, the deposition of each layer may be the same or a combination of deposition methods can be used. After applying ARC 106, particularly those from a liquid phase, a post deposition baking step is usually needed to remove unwanted components, such as solvent, and to effect crosslinking. The post deposition baking step of ARC 106 is typically, but not necessarily always, performed at a temperature from 80° C. to 300° C., with a baking temperature from 120° C. to 200° C. being even more typical. Other post-deposition treatments (e.g., similar to cap layer 104) may be performed.

Figure 1B:
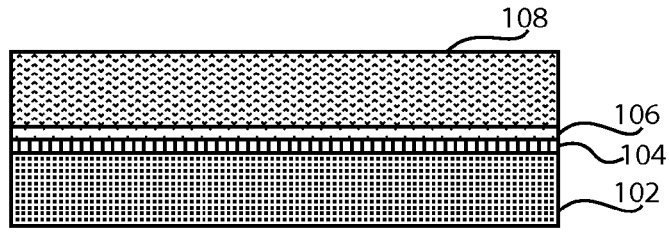
FIG. 1B shows a cross-sectional view of the device of FIG. 1A having an interlevel dielectric layer formed thereon in accordance with one illustrative embodiment.

Referring to FIG. 1B, a dielectric material 108 is deposited to form an interlevel dielectric (ILD). The deposition process for the ILD 108 includes, for example, chemical vapor deposition (CVD), physical vapor deposition, spin-on-coating, dip coating, brush coating, doctor blade coating, ink-jet dispensing, etc. After applying the ILD material 108, a post deposition baking step may be employed to remove unwanted components, such as solvent. When performed, the baking step is conducted at a temperature from 40° C. to 200° C., with a baking temperature from 60° C. to 140° C. being even more preferred. The duration of the baking step varies from 10 seconds to 600 seconds and is not critical.

The ILD 108 includes any dielectric material composition that is compatible with adjacent structures and materials. In particularly useful embodiments, the ILD 108 includes SiN, $SiO_2$, organic dielectrics, (e.g., polyimide), dielectric resists, etc. In one embodiment, the ILD 108 may be used as deposited as a permanent ILD. In another embodiment, the ILD 112 may be cured to form a patterned permanent dielectric (e.g., the ILD 108 includes a photo-patternable low k (PPLK) material). It is noted that the photo-patternable low k materials are subsequently converted into a low-k dielectric insulator during a post patterning cure process.

The thickness of the material 108 may vary depending on the requirements of a chip being fabricated, the method being employed to form the same, and the make-up of the material 108. For example, the material 108 may have a thickness from 1 nm to 50,000 nm, with a thickness from 20 nm to 5000 nm being preferred.

Figure 1C:
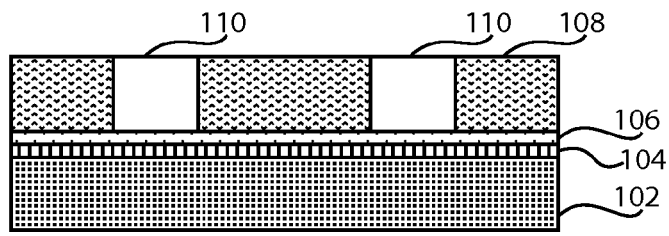
FIG. 1C shows a cross-sectional view of the device of FIG. 1B showing the interlevel dielectric layer patterned in accordance with one illustrative embodiment.

Referring to FIG. 1C, a positive- or negative-tone resist (not shown) is employed to form an etch mask to etch the ILD 108 to form contact openings or channels 110. The resist is exposed to irradiation and then developed. A reactive ion etch (RIE) or other suitable process is employed to form openings 110. The openings 110 provide channels or regions to form electrical contacts and functional components as will be described later in the process. Since the openings 110 are patterned using lithographic methods, pattern features may be formed with a plurality of different shapes and sizes. In one embodiment, the openings 110 are formed having a minimum feature size (F) of a given technology. The later-formed functional component (see FIG. 1G) occupies a contact opening volume for the given feature size and within a height of the interlevel dielectric layer 108.

Figure 1D:
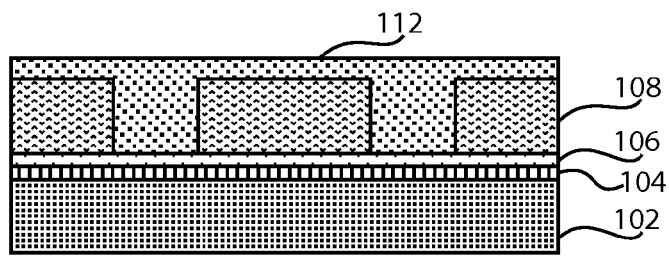
FIG. 1D shows a cross-sectional view of the device of FIG. 1C showing a sacrificial patternable dielectric composition formed in accordance with one illustrative embodiment.

Referring to FIG. 1D, the patterned ILD 108 is covered and the openings 110 are filled with a patternable sacrificial material 112. In one embodiment, the patternable sacrificial material includes photo-patternable low k (PPLK) material 112. It is noted that the photo-patternable low k (PPLK) material 112 as employed herein may include any dielectric materials possessing two functions. The material 112 acts as a photoresist during a patterning process and is subsequently converted into a low-k dielectric insulator during a post patterning cure process. The cured product of a PPLK material, therefore, can serve as a permanent on-chip dielectric insulator. The photo-patternable low k material 112 employed herein can be deposited in a liquid phase.

The term "photo-patternable low k material" (or PPLK) includes a functionalized polymer, copolymer or blend including at least two of any combination of polymers and/or copolymers having one or more acid-sensitive imageable groups. The PPLK material 112 acts as a photoresist, and after curing, it is converted into a dielectric material having a dielectric constant of about 7.0 or less. It is noted that when the PPLK material is comprised of a polymer, the polymer includes at least one monomer (to be described in greater detail below). When the PPLK material 112 is comprised of a copolymer, the copolymer includes at least two monomers (to be described in greater detail below). The blends of polymers and/or copolymers include at least two of any combination of polymers and/or copolymers described herein.

In one embodiment, the PPLK material 112 is a photo-patternable composition including a polymer, a copolymer, or a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

More specifically, the PPLK material 112 that can be employed is a photo-patternable composition comprising a photo/acid-sensitive polymer of one monomer or a copolymer of at least two monomers selected from siloxane, silane, carbosilane, oxycarbosilane, organosilicates, silsesquioxanes and the like. The PPLK material 112 may also be photo-patternable composition comprising a polymer of one monomer or a copolymer of at least two monomers selected from alkyltrialkoxysilane, tetra-alkoxysilane, unsaturated alkyl (such as vinyl) substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

Additionally, the PPLK material 112 may comprise a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

Optionally, the PPLK material 112 may be a photo-patternable composition further comprising at least one microscopic pore generator (porogen). The pore generator may be or may not be photo/acid sensitive. Illustrative polymers for the PPLK material 112 include, but are not limited to, siloxane, silane, carbosilane, oxycarbosilane, silsesquioxane-type polymers including caged, linear, branched or combinations thereof. In one embodiment, the PPLK material 112 is a photo-patternable composition comprising a blend of these photo/acid-sensitive polymers.

The PPLK material 112 is formed from a photo-patternable composition (negative-tone or positive-tone) that includes at least one of the above mentioned polymers, copolymers or blends, a photoacid generator, a base additive and a solvent used in a photoresist composition. When the PPLK material 112 is a negative-tone photo-patternable material, it may be formed from a patternable composition optionally including an additional cross-linker. By "negative-tone" it is meant that the part of the PPLK material 112 that is exposed to an actinic irradiation will not be removed by a conventional developer, while the unexposed part of the PPLK material 112 is removed.

The additional cross-linker can be a small compound (as compared with a polymer or copolymer) or a polymer, a copolymer, or a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

When the PPLK material 112 is a positive-tone photo-patternable material, it is formed from a patternable composition that includes at least one of the above mentioned polymers, copolymers or blends wherein the polymers, copolymers or blends containing at least photo/acid imageable functional group to form positive-tone patterns, a photoacid generator, a base additive and a solvent used in a photoresist. By 'positive-tone" it is meant that the part of the PPLK material 112 that is exposed to an actinic irradiation will be removed by a conventional developer, while the unexposed part of the PPLK material is not removed. The photoacid generators, base additives and solvents are well known to those skilled in the art.

Figure 1E:
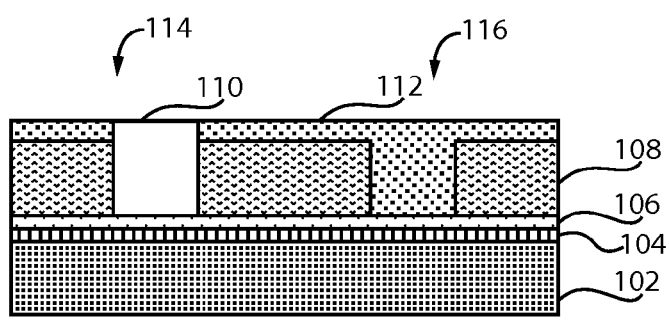
FIG. 1E shows a cross-sectional view of the device of FIG. 1D showing the sacrificial patternable dielectric composition patterned to open up a portion of the openings formed in FIG. 1C in accordance with one illustrative embodiment.

Referring to FIG. 1E, the sacrificial patternable material 112 is patterned to selectively remove material 112 from a portion 114 of the openings 110. This may include forming a mask (not shown) using lithography and processing the material 112 in selected holes or openings 110 to remove the material 112 therefrom. The processing may include exposing and developing material 112, etching away material 112, decomposing material 112, etc. to remove the materials 112 in accordance with the mask (not shown).

The pattern-wise exposing process can be accomplished in a variety of ways, including, for example, exposure through the mask with a lithography stepper or a scanner with an exposure light source of G-line, I-line (365 nm), deep UV (DUV) (248 nm, 193 nm, 157 nm, 126 nm), Extreme UV (EUV) (13.4 nm, 6.5 nm), an electron beam, an ion beam, etc. The exposing process may be performed in a dry mode or an immersion mode. The exposing process may be performed with a single exposure or multiple exposures. The pattern-wise exposing process may include direct writing without the use of a mask with, for example, light, electron beam, ion beam, and scanning probe lithography. Other patterning techniques that can be used include contact printing techniques such as nanoimprint lithography, embossing, micro contact printing, replica molding, microtransfer molding, micromolding in capillaries and solvent-assisted micromolding, thermal assisted embossing, inject printing, and the like.

The sacrificial patternable material 112 is stable as deposited and patternable as a block mask. The block mask portion remains intact for portion 116 of the openings 110, and portion 114 of the openings 110 are opened up to form functional devices therein in later steps. The openings 110 in portion 116 are recovered by removal of the patternable sacrificial material 112 in later steps.

Figure 1F:
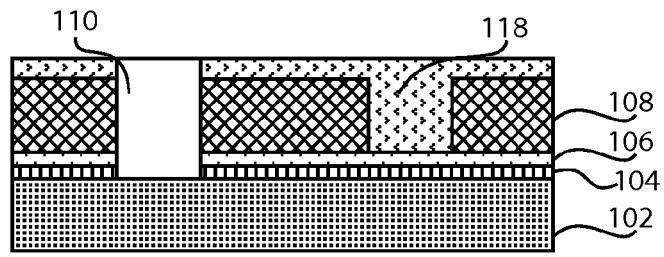
FIG. 1F shows a cross-sectional view of the device of FIG. 1E showing the sacrificial patternable dielectric composition cured in accordance with one illustrative embodiment.

Referring to FIG. 1F, if ARC 106 or cap layer 104 are employed, an ARC/cap open process is employed to expose the underlying substrate 102 in the portion 114 of openings 110. The ARC/cap open process preferably includes an etching process that selectively etches one or both of the ARC 106 and/or cap layer 104 relative to the layers 108 and 112. Next, the material 112 is cured. In the present disclosure, the terms "cure" or "curing" are used interchangeable to refer one of the processes selected from a thermal cure, an electron beam cure, an ultra-violet (UV) cure, an ion beam cure, a plasma cure, a microwave cure or a combination thereof. A "cured" product of a photo-patternable low k material (112) is the product of the photo-patternable low k material after it has undergone one of the aforementioned cure processes. The "cured" product of a photo-patternable low k material is different from the photo-patternable low k material in chemical nature and physical, mechanical and electrical properties. The curing may be performed with heat, UV, or E-beam. A cured patterning film results and provides a dielectric material 118 which is employed to protect underlying layers during forming of functional devices in subsequent steps.

The conditions for each of the curing processes are known to those skilled in the art and any condition can be chosen as long as it covers the photo-patternable low k material into a low k film and maintains pattern fidelity. In one embodiment, an irradiation cure step is performed by a combination of a thermal cure and an ultra-violet (UV) cure wherein the wavelength of the ultra-violet (UV) light is from 50 nm to 300 nm and the light source for the ultra-violet (UV) cure is a UV lamp, an excimer (exciplex) laser or a combination thereof. The excimer laser may be generated from at least one of the following excimer lasers: $Ar_2^*$, $Kr_2^*$, $F_2$, $Xe_2^*$, ArF, KrF, XeBr, XeCl, XeCl, XeF, $CaF_2$, KrCl, and $Cl_2$ wherein the wavelength of the excimer laser is in the range from 50 nm to 300 nm. Additionally, the light of the ultra-violet (UV) cure may be enhanced and/or diffused with a lens or other optical diffusing device known to those skilled in the art.

In one embodiment, the cure is a combined UV/thermal cure. This combined UV/thermal cure is carried on a UV/thermal cure module under vacuum or inert atmosphere, such as, in $N_2$, He or Ar. The UV/thermal cure temperature may be from 100° C. to 500° C., with a cure temperature from 300° C. to 450° C. being more common. The duration of the UV/thermal cure is from 0.5 min to 30 min with duration from 1 min to 10 min being more common. The UV cure module is designed to have a very low oxygen content to avoid degradation of the resultant dielectric materials.

The thickness of the patterned and cured PPLK material 118 on material 108 may vary depending on the requirements of the chip and the technique used to form the same, as well as the material make-up of the layer. The PPLK material 118 may have a thickness, e.g., from 1 nm to 50000 nm, with a thickness from 10 nm to 500 nm being preferable.

Figure 1G:
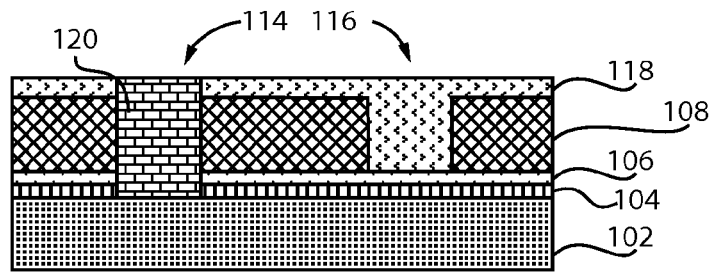
FIG. 1G shows a cross-sectional view of the device of FIG. 1F showing a functional component formed in the opening in the interlevel dielectric layer in accordance with one illustrative embodiment.

Referring to FIG. 1G, a functional component 120 is formed in the portion 114 of the openings 110. The patternable fill material 118 is cured to make it to withstand component element processing to form the functional component(s) 120. The functional components 120 may include active electronic elements or passive electronic elements. In either case, the functional components 120 perform an electrical task other than just conducting current flow, e.g., the component 120 stores charge, regulates charge, directs charge, switches charge, etc. A non-exhaustive list of functional components 120 may include a capacitor, a resistor, an inductor, a transistor, a memory element, a diode, etc. In particularly useful embodiments, the functional component 120 includes a vertical transistor, a phase change memory, a vertical or horizontal capacitor, a diode, etc. Forming the functional component 120 includes forming structural elements needed for its proper function which, for the most part occupies a volume the size of the openings 110 of portions 114. The functional component 120 may be formed to occupy a contact opening volume for the given feature size and within a height of the interlevel dielectric layer 108, although openings 110 may be made larger to accommodate other sized functional components 120.

Figure 1H:
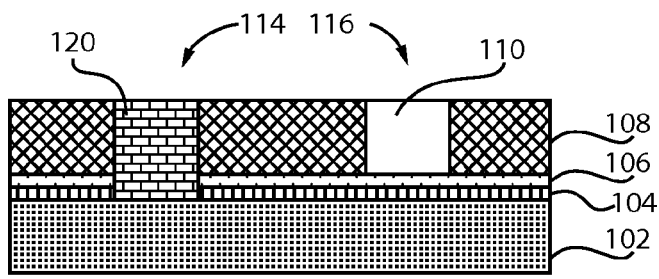
FIG. 1H shows a cross-sectional view of the device of FIG. 1G showing the block mask removed to open up another portion of the openings formed in FIG. 1C in accordance with one illustrative embodiment.

Referring to FIG. 1H, the dielectric material 118 is removed from the surface of the ILD 108 and from within the portion 116 of openings 110. The dielectric material 118 is removed from the surface of the ILD 108 by a planarizing process such as a chemical mechanical planarization (CMP) operation. The CMP exposes the surface of the ILD 108 and the functional components 120. Selective removal of the cured sacrificial material 118 is performed to recover the openings 110 in the portion 116. The cured sacrificial material 118 may be removed by an etch, such as, a reactive ion etch (RIE) to remove the cured sacrificial material 118 from the remaining openings 110. The etching may continue to open ARC 106 and/or cap layer 104 if present to gain access to underlying layers.

Figure 1I:
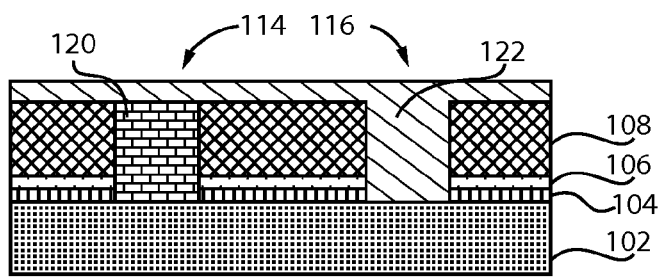
FIG. 1I shows a cross-sectional view of the device of FIG. 1H showing contact holes filled to form contacts in accordance with one illustrative embodiment.

Referring to FIG. 1I, a metallization process includes depositing a conductor 122 into openings 110 in portion 116 of ILD 108 and over a top surface of ILD 108. The conductor 122 may include copper, aluminum, tungsten, titanium, tantalum, electrically conductive carbon materials such as carbon nanotubes and graphene, doped polysilicon or any other useful conductive materials, or alloys/combinations thereof. The conductive contact structure also may include a barrier layer when the conductive contact metal is Cu or a conductive catalyst when the conductive carbon materials are employed.

The conductor 122 may be deposited using chemical vapor deposition (CVD), atomic layer deposition, plating, or other deposition techniques. The openings 110 are filled with electrically conductive material 122 which takes the shape of the openings 110.

Figure 1J:
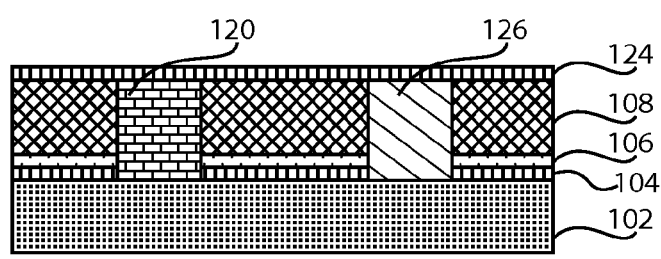
FIG. 1J shows a cross-sectional view of the device of FIG. 1I showing a cap layer formed over the contacts and the functional components in accordance with one illustrative embodiment.

Referring to FIG. 1J, a chemical-mechanical polish (CMP) is performed to remove excess conductor 122 from the surface of ILD 108 to form contacts 126 in contact with underlying structures (e.g., contact pads, silicides regions, metal lines, doped regions, etc.). Other planarization processes may also be employed. The contacts 126 are formed on the same layer as the functional components 120. The functional components 120 may permit added complexity to the integrated circuit design by permitting selective connections between front end of line (FEOL) devices and interconnects or back end of line (BEOL) structures. For example, in one embodiment, a conductor or transistor on the substrate 102 may enable the functional device 120 (e.g., a vertical transistor) to make a connection between the substrate 102 and an upper metal layer (e.g., in a layer over contact 126). In another embodiment, the function component 120 includes a capacitor or phase change memory element, and the transistors in the substrate 102 may be employed to read or write a state to the functional device 120 (e.g., a capacitor or the phase change memory). Other applications are also contemplated and not limited to the illustratively described examples herein.

An optional cap layer 124 may be formed over the functional component 120 and the contacts 126. It should be understood that additional ILDs, metal layers and functional components may be provided in upper layers of the design. In one embodiment, the present methods are modified to provide a dual damascene structure instead of or in addition to the single damascene structure depicted. Processing can continue using processes in accordance with the present principles and known processes.

Figure 2:
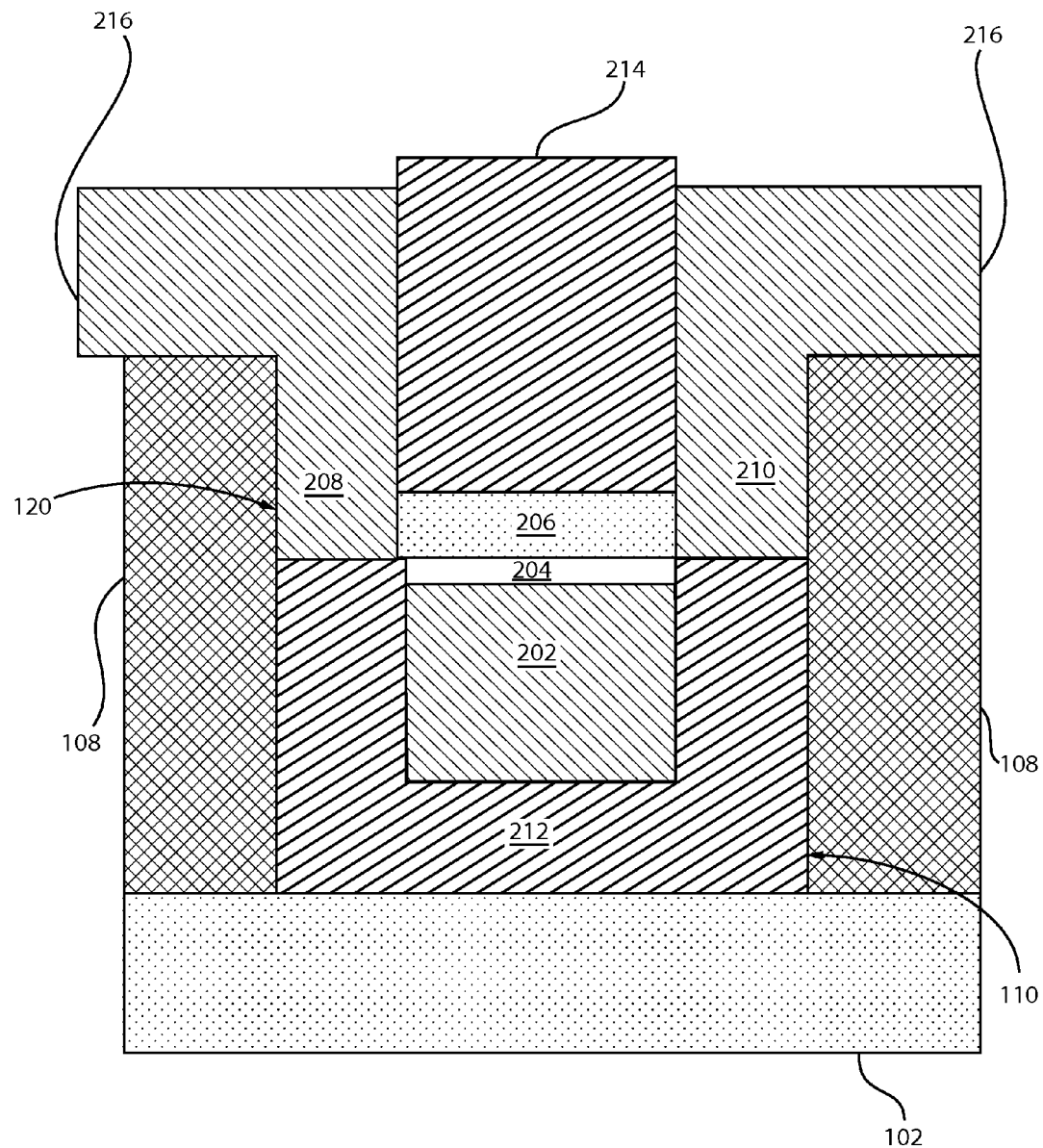
FIG. 2 shows a cross-sectional view of a transistor device formed as a functional component in a same layer as contacts in accordance with another illustrative embodiment.

Referring to FIG. 2, in one illustrative embodiment, functional component 120 includes a transistor device. The transistor includes a gate conductor 202 and a gate dielectric 204 formed within a dielectric layer 212. The gate conductor 202 may be activated through a connection (not shown) further down into or out of the page. An active region 206 may include a semiconducting material such as doped crystalline silicon, carbon materials, such as carbon nanotubes, graphene, etc. Source 208 and drain 210 electrodes are formed with metal lines 216. The metal lines 216 are formed on a next level of the interconnect structure. A dielectric material 214, which may include an interlevel dielectric layer of a higher layer, is formed between the source and drain electrodes 208, 210.

The transistor of functional component 120 is formed within an opening 110 in a set or portion 114 (FIG. 1E). The transistor in this embodiment can act as a switch to connect nearby metal lines 216. It should be understood that other transistor configurations may be employed instead of or in addition to the one depicted. In other embodiments, the transistor may include a vertical transistor and connect an underlying layer or substrate with metal lines 216 in a higher layer.

Figure 3:
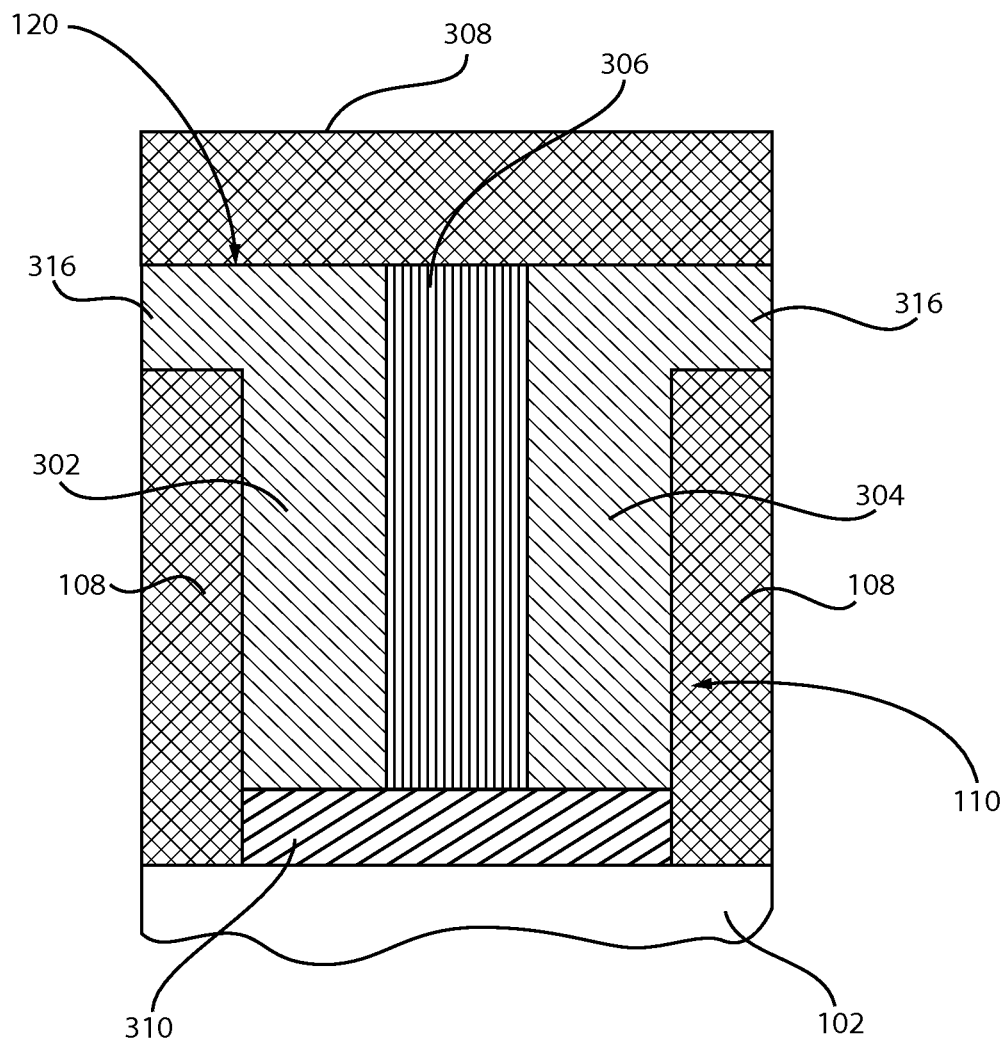
FIG. 3 shows a cross-sectional view of a memory element formed as a functional component in a same layer as contacts in accordance with another illustrative embodiment.

Referring to FIG. 3, in another illustrative embodiment, functional component 120 includes a memory cell or capacitor. A capacitor includes electrodes 302 and 304. Electrodes 304 and 306 may be formed with or connected to metal lines 316. A material 306 is disposed between the electrodes 302 and 304. In one embodiment, the material includes a dielectric material in another embodiment, the material 306 may include a phase change material, which is responsive to electrical, thermal or magnetic properties of or induced by the electrodes 302 and 304 to read or write a state (phase) to/from the material 306. Depending on the substrate 102 directly below, a dielectric layer 310 may be formed between the memory cell (120) and the substrate 102.

The memory cell/capacitor of functional component 120 is formed within an opening 110 in a set or portion 114 (FIG. 1E). The memory cell/capacitor in this embodiment can act as a storage device and work with other circuitry to store data or store energy. It should be understood that other configurations may be employed instead of or in addition to the one depicted. In other embodiments, the component 120 may include a horizontal capacitor or a trench capacitor, for example. Layer 308 may include an interlevel dielectric layer for a higher level.

Figure 4:
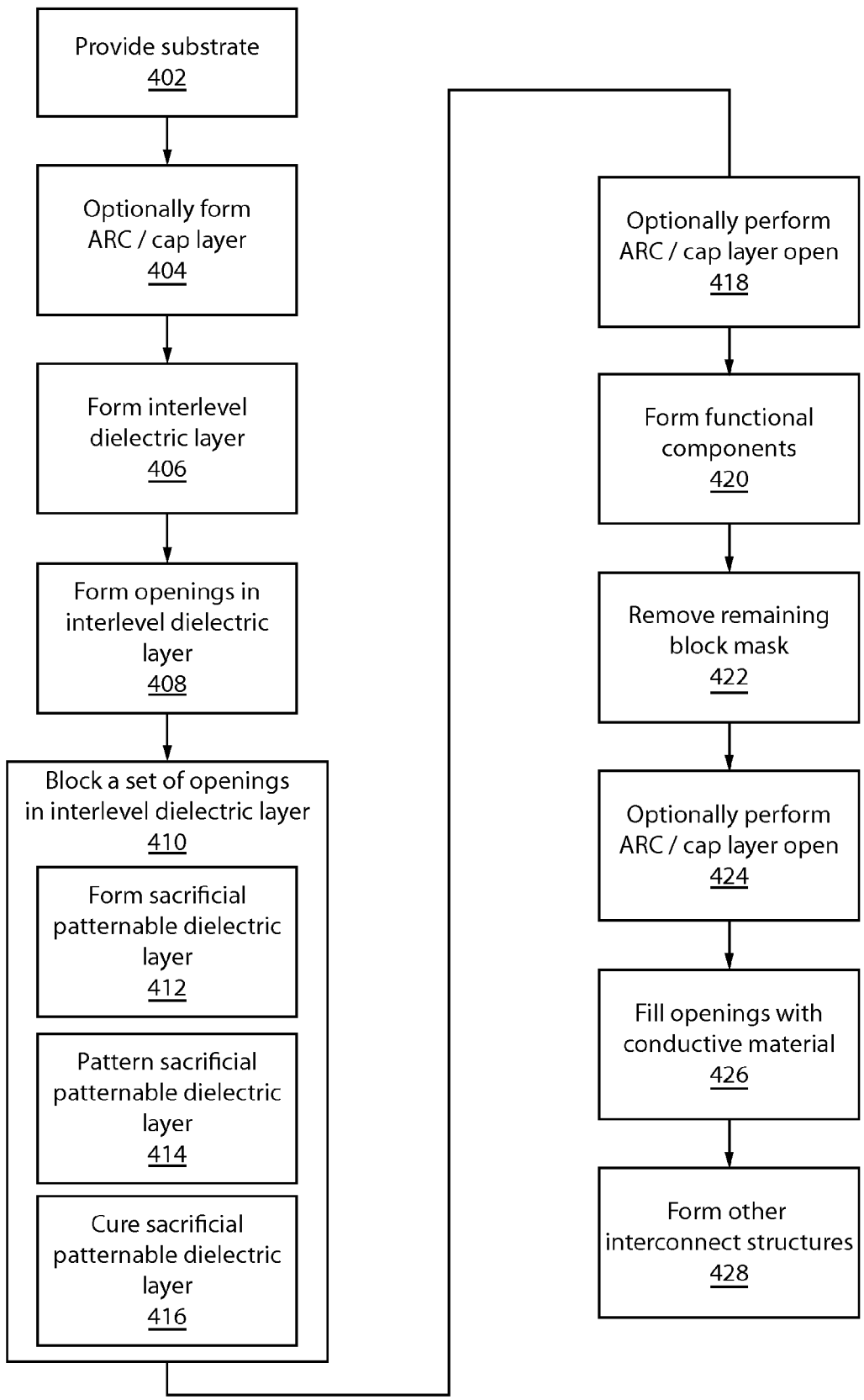
FIG. 4 shows a block/flow diagram of a method for fabricating a device with functional components formed in a back end of line (BEOL) structure in accordance with another illustrative embodiment.

Referring to FIG. 4, a method for fabricating back end of line structures having functional components on a same level is illustratively shown. In block 402, a substrate is provided that may include conducting materials, semiconducting materials, dielectric materials or combinations thereof. In addition, the substrate may include multiple layers and multiple components, etc. In block 404, a permanent antireflective coating (ARC) and/or cap layer is/are formed on the substrate. In block 406, an interlevel dielectric layer is formed over the substrate. In block 408, the interlevel dielectric layer is patterned to form openings therein.

In block, 410, a first set of the openings are blocked using a block mask. In block 412, a sacrificial patternable dielectric layer may be formed over a top surface of the interlevel dielectric layer and in the openings. The sacrificial patternable dielectric layer is patterned to remove the sacrificial patternable dielectric layer from the second set of the openings and leave the sacrificial patternable dielectric layer as the block mask in the first set of the openings in block 414. The sacrificial patternable dielectric layer may include a photo-patternable low-k (PPLK) material.

In block 416, the sacrificial patternable dielectric layer is cured on the top surface of the interlevel dielectric layer and in the first set of the openings to convert the sacrificial patternable dielectric layer into a cured dielectric layer. The cured dielectric layer acts as a protective layer to protect features during the formation of functional components in subsequent processing. The curing preferably includes one or more of a thermal cure, an electron beam cure, an UV cure, an ion beam cure, a plasma cure, a microwave cure or any combination thereof.

In block 418, an ARC/cap layer open process may be performed to make electrical connections to the substrate in a second set of openings.

In block 420, functional components are formed in the second set of openings. This may include forming a transistor device, a diode, a memory element, a capacitor, etc. in the second set of openings. Other structures or devices are also contemplated. In block 422, the remaining block mask is removed. In block 424, an ARC/cap layer open process may be performed in the first set of openings to make electrical connections to the substrate. In block 426, the first set of openings is filled with an electrically conductive fill material to form electrically conductive contacts which occupy a same level as the functional components. In block 428, a conducting material or additional layers are formed over the interlevel dielectric layer, and the conductive material is connected to the functional component (and/or the contacts).

Having described preferred embodiments for interconnect structures with functional elements and methods for fabrication (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method, comprising:
   forming an interlevel dielectric layer over a substrate;
   patterning the interlevel dielectric layers to form openings therein;
   blocking a first set of the openings with a block mask;
   forming functional components in a second set of openings;
   planarizing the surface of the functional components and the block mask in the first set of the openings;
   removing the block mask to recover the first set of openings in the interlevel dielectric layer; and
   filling the first set of openings with an electrically conductive fill material to form electrically conductive contacts which occupy a same level as the functional components.

2. The method as recited in claim 1, wherein forming functional components includes forming at least one of a transistor device, a memory element, a capacitor or a diode in the second set of openings.

3. The method as recited in claim 1, further comprising forming a permanent antireflective coating (ARC) on the substrate and performing an ARC open process to make electrical connections to the substrate.

4. The method as recited in claim 1, further comprising forming a conducting material over the interlevel dielectric layer and connecting the conductive material to the functional component.

5. The method as recited in claim 1, wherein blocking a first set of the openings with a block mask includes:
   forming a sacrificial patternable dielectric layer over a top surface of the interlevel dielectric layer and in the openings;
   patterning the sacrificial patternable dielectric layer to remove the sacrificial patternable dielectric layer from the second set of the openings and leaving the sacrificial patternable dielectric layer as the block mask in the first set of the openings; and
   curing the sacrificial patternable dielectric layer on the top surface of the interlevel dielectric layer and in the first set of the openings to convert the sacrificial patternable dielectric layer into a cured dielectric layer.

6. The method as recited in claim 5, wherein curing includes one or more of a thermal cure, an electron beam cure, an ultraviolet cure, an ion beam cure, a plasma cure, a microwave cure or any combination thereof.

7. The method as recited in claim 5, wherein forming a sacrificial patternable dielectric layer includes forming the sacrificial patternable dielectric layer from a photo-patternable low-k (PPLK) material.

8. The method as recited in claim 7, wherein the photo-patternable low-k (PPLK) material includes at least one of a polymer, a copolymer, a blend including at least two of any combination of polymers and/or copolymers, wherein the polymers include one monomer and the copolymers include at least two monomers and wherein the monomers of the polymers and the monomers of the copolymers are selected from: a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

9. The method as recited in claim 1, wherein forming functional components includes forming the functional components in a contact opening volume for a given feature size of a device technology within a height of the interlevel dielectric layer.

10. A method, comprising:
    forming an interlevel dielectric layer over a substrate;
    patterning the interlevel dielectric layer to form openings therein;
    forming a sacrificial patternable dielectric layer over a top surface of the interlevel dielectric layer and in the openings of the interlevel dielectric layer;
    patterning the sacrificial patternable dielectric layer to remove the sacrificial patternable dielectric layer from a second set of the openings and leaving the sacrificial patternable dielectric layer as a block mask in a first set of the openings;
    curing the sacrificial patternable dielectric layer on the top surface of the interlevel dielectric layer and in the first set of the openings to convert the sacrificial patternable dielectric layer into a cured dielectric layer;
    forming functional components in the second set of openings;
    planarizing a surface of the functional components and the block mask in the first set of the openings;
    removing the cured dielectric layer to recover the first set of openings in the interlevel dielectric layer; and
    filling the first set of openings with an electrically conductive fill material to form electrically conductive contacts which occupy a same level as the functional components.

11. The method as recited in claim 10, wherein forming functional components includes forming at least one of a transistor device, a memory element, a capacitor or a diode.

12. The method as recited in claim 10, wherein forming functional components includes forming the functional components in a contact opening volume for a given feature size of a device technology within a height of the interlevel dielectric layer.

13. The method as recited in claim 10, wherein forming a sacrificial patternable dielectric layer includes forming the sacrificial patternable dielectric layer from a photo-patternable low-k (PPLK) material.

14. The method as recited in claim 13, wherein the photo-patternable low-k (PPLK) material includes at least one of a polymer, a copolymer, a blend including at least two of any combination of polymers and/or copolymers, wherein the polymers include one monomer and the copolymers include at least two monomers and wherein the monomers of the polymers and the monomers of the copolymers are selected from: a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

15. The method as recited in claim 10, further comprising forming a permanent antireflective coating (ARC) on the substrate and performing an ARC open process to make electrical connections to the substrate.

16. The method as recited in claim 10, wherein curing includes one or more of a thermal cure, an electron beam cure, an ultraviolet cure, an ion beam cure, a plasma cure, a microwave cure or any combination thereof.

17. The method as recited in claim 10, further comprising forming a top electrically conductive material over the interlevel dielectric layer and connecting the top electrically conductive material to the functional component.

* * * * *